United States Patent [19]

Mawby

[11] Patent Number: 4,846,739

[45] Date of Patent: Jul. 11, 1989

[54] GAS IMPERVIOUS CRIMP CONNECTION

[75] Inventor: Terry P. Mawby, Mission, Kans.

[73] Assignee: Interconnect Devices, Inc., Kansas City, Kans.

[21] Appl. No.: 130,013

[22] Filed: Dec. 8, 1987

[51] Int. Cl.$^4$ .............................................. H01R 4/20
[52] U.S. Cl. ...................................... 439/877; 403/284
[58] Field of Search .............................. 439/865–868, 439/877–882; 403/284, 285, 274; 174/84 C; 29/861, 863

[56] References Cited

U.S. PATENT DOCUMENTS

| | | | |
|---|---|---|---|
| 2,109,837 | 3/1938 | Davis | 29/517 |
| 2,288,348 | 6/1942 | Funk | 439/868 |
| 2,693,216 | 11/1954 | Kerchner et al. | 439/877 |
| 2,735,997 | 2/1956 | Peterson | 439/882 |
| 3,076,255 | 2/1963 | Woolley, Jr. | 29/862 |
| 3,126,443 | 3/1964 | Stevens, Jr. | 174/84 |
| 4,322,123 | 3/1982 | Newell | 29/751 |

Primary Examiner—Gary F. Paumen
Attorney, Agent, or Firm—Wm. Bruce Day

[57] ABSTRACT

An electrically conductive joint between a conductor and a connector includes a metallic tube and a crimp in the tube to secure a conductor therein. The crimp has a V-shaped outer portion and a substantially V-shaped inner portion including converging walls and a truncated apex with the angle of the inner and outer V-shaped portions being substantially the same. The conductor is secured within the tube in a substantially gas impervious relationship for use in pneumatically operated probe carrying fixtures for testing printed circuit boards.

7 Claims, 1 Drawing Sheet

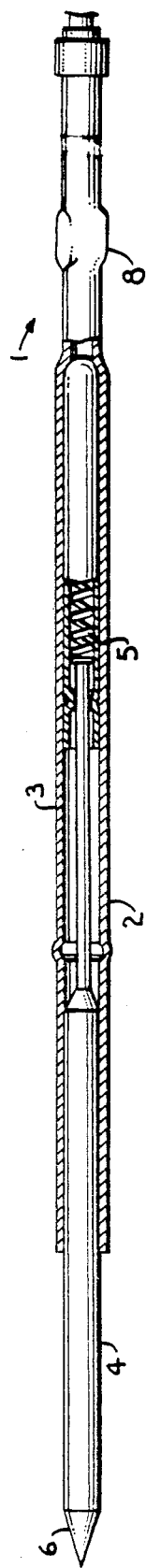
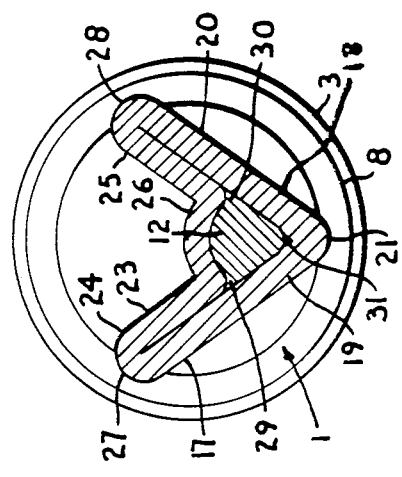
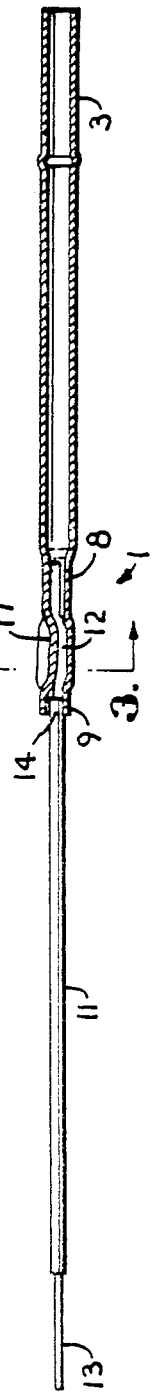
Fig. 1.
Fig. 3.
Fig. 2.

GAS IMPERVIOUS CRIMP CONNECTION

FIELD OF THE INVENTION

The present invention relates to crimp joints for electrical connections and more particularly, to a crimp joint used in connection with wires leading into test probes for PCB boards.

BACKGROUND OF THE INVENTION

Spring contact probes are commonly used for testing printed circuit boards on flex circuits, substrates, connectors, back planes and other circuitry where a number of contact points must be accessed. Such contact probes are mounted in fixtures which are moved toward and away from the testing subject by electromechanical means or pneumatic means. When a vacuum is pulled between the subject mounting fixture portion and the probe mounting fixture portion, any gas leakage routes through the fixture are soon noted. One of the avenues for gas leakage is through the probe/fixture connections. This route of leakage can be alleviated by seals and close tolerance manufacturing. Another route of leakage can occur through the electrical connector/probe juncture; the present invention is directed toward providing a gas impervious crimp connection particularly adapted for vacuum fixture applications. Moreover, a requirement of the juncture or joint is that the crimp cannot extend outwardly beyond the projection of the diameter of the probe tube, so that the probe and connection can be inserted into the fixture. This requires a crimp to tube ration of approximately four to five. As a third consideration, the pull out force of the conductor wire must be sufficiently high, and preferably greater than the tensile strength of the wire, so that the wire cannot become loose from the connection.

SUMMARY OF THE INVENTION

The present invention provides an electrically conductive joint between a conductor and a connector which develops an air seal for vacuum fixtures with less than 4.25 ml/minute leakage with fifteen psi of air applied. The crimp is of sufficient strength so that the pull out force exceeds the tensile strength of the wire. Additionally, the crimp edges do not lie outside of the projection of the diameter of the probe body, particularly adapting the instant formation for use in spring contact probes.

The connector uses a particular V-shaped crimp with outer and inner V-shaped portions. The inner V-shaped crimp portion has converging walls and a truncated apex, with the angle of the inner and outer crimp portions being the same or substantially the same, whereby the conductor is secured within a joint or tube in a substantially gas impervious relationship.

The crimp connection is particularly suitable for extremely small diameter probes, such as those having a tube diameter in the order of 0.034 inch outside diameter, with wire inserted therein having an outside diameter in the order of 0.010 inch.

OBJECTS OF THE INVENTION

The principal objects of the present invention are: to provide a substantially gas impervious air sealed electrically conductive joint, commonly called a gas-tight and vacuum tight connection, between a conductor and a connector for use in connections to spring contact probes; to provide such a joint including a crimp which does not lie outside of the projection of the diameter of the probe body; to provide such a joint of such substantial strength that the pull out force of the conductor wire exceeds the tensile strength of the wire; to provide such a joint which does not unduly damage or deform the conductor wires so as to degrade its tensile strength or conductivity; to provide such a joint which does not deform the material of the probe body adjacent thereto; and to provide such an electrically conductive joint which is economical to manufacture, efficient and durable in operation and which is particularly well adapted for its intended purpose.

Other objects and advantages of this invention will become apparent from the following description taken in conjunction with the accompanying drawings wherein are set forth, by way of illustration and example, certain embodiments of this invention.

BRIEF DESCRIPTION OF THE DRAWINGS

FIG. 1 is a plan view of an electrically conductive joint between a conductor and connector comprising the present invention and shown in conjunction with a spring contact probe.

FIG. 2 is an enlarged detail of the conductive joint shown in FIG. 1.

FIG. 3 is a greatly enlarged sectional view taken along lines 3—3, FIG. 2.

DETAILED DESCRIPTION OF THE PREFERRED EMBODIMENT

As required, a detailed embodiment of the present invention is disclosed herein, however, it is to be understood that the disclosed embodiment is merely exemplary of the invention which may be embodied in various forms. Therefore, specific structural and functional details disclosed herein are not to be interpreted as limiting, but merely as basis for the claims and as a representative basis for teaching one skilled in the art to variously employ the present invention in virtually any appropriately detailed structure.

Referring to the drawings in more detail:

The reference numeral 1 generally designates an electrically conductive joint embodying the present invention. As shown in FIG. 1, the joint 1 may be in conjunction with a spring contact probe 2 including a barrel body 3 and a plunger 4. The barrel body 3 includes an internal spring 5 urging the plunger 4 outwardly and the plunger tip 6 into contact with a test point on a printed circuit board, substrate or the like surface to be electrically tested for circuit continuity.

The spring contact probe 2 is operationally emplaced within a fixture (not shown) which positions a plurality of probes 2 in the proper relationship for testing a subject PCB or other electrical circuit. Some of these fixtures are vacuum operated and loss of vacuum may be incurred through leakage between the probe 2 and the fixture. In other instances, leakage can occur through a poor or loose fitting connection between the electrical connector leading into the probe 2 and the barrel body 3.

In particular, the joint 1 is formed from a tube 8 having an open end 9. The tube 8 is preferably an extension of the barrel body 3 which forms a connector assembly. A conductor such as an insulated wire 11 has a stripped end 12 extending into the tube 8 and a remote end 13 which may be connected to electrical testing equipment. The wire 11 is positioned with respect to the tube 8 so that the stripped end 12 extends thereinto and an insulative coating 14 is inserted into the open end 9.

The joint 1 is substantially formed of a crimp 17 which, in enlarged detail, FIG. 3, is formed of a substantially V-shaped outer portion 18 comprised of arms 19 and 20 joined at an apex 21 and extending at approximately a seventy degree angle. An inner crimp portion 23 includes converging arms 24 and 25 similarly positioned at approximately a seventy degree angle and joined at an inner truncated apex 26. The arms 24 and 25 of the inner crimp portion 23 join the arms 19 and 20 of the outer crimp portion 18 at edges 27 and 28 which are spaced from each other less than the diameter of the barrel body 3 so that the probe can be inserted into a fixture hole.

Preferably, the truncated apex 26 is formed to be arched or curved outwardly so as to be concave to the stripped wire end 12 positioned in the crimp convergence of the outer and inner crimp portions 18 and 23.

In the illustrated example, the wire 11 is a solid conductor although stranded wires may also be used in conjunction with the instant invention. In the crimped portion, the wire 11, normally of malleable copper alloy, tends to flow upon the application of crimping die pressure and flows into at least corners 29 and 30 and in some instances also the apex corner 31 so as to tightly fill the interior cavity between the inner and outer crimp portions, thereby effectively sealing the crimp-/wire connection against internal leakage. The crimp is also configured so that the arms 19 and 20 join with the inner arms 24 and 25 in one hundred and eighty degree bends so that the arms lie flat against each other, also tending to secure the crimp 17 against leakage.

In the formation of the crimp 17, anvil and male die sets are positioned so that the tube 8 is between the die jaws and pressure is applied to form the crimp 17. The dies are substantially in the form evidenced by the crimp formation. Preferably, the operation is entirely automatic including positioning means for the wire 11 within the tube 8 so that quality control is maintained.

It is to be understood that while certain forms of the present invention have been illustrated and described herein, it is not to be limited to the specific form or arrangement of parts described and shown.

What is claimed and desired to be secured by Letters Patent is as follows:

1. An electrically conductive joint between a conductor and a connector, comprising:
   (a) a metallic tube including a seamless ferrule adjacent to one end to receive a conductor;
   (b) a crimp in said tube to secure said conductor within said ferrule;
   (c) said crimp including a substantially V-shaped outer crimp portion; and
   (d) said crimp including an inner crimp portion of substantially V-shaped and having converging walls and a truncated apex, said inner crimp portion engaging said outer crimp portion except in the area of said truncated apex;
   (e) whereby said conductor is secured within said tube in a substantially gas impervious relationship.

2. The joint set forth in claim 1 wherein:
   said conductor is formed of a malleable material flowable under pressure and which flows into a sealing relationship in the area of said truncated apex.

3. The joint set forth in claim 1 wherein:
   said tube has a substantially circular open end receiving said conductor and said crimp is spaced from said open end.

4. The joint set forth in claim 1 wherein:
   said truncated apex has a reverse curve which is concave with respect to said conductor.

5. The joint as set forth in claim 1 wherein:
   said conductor is formed of a malleable material flowable under pressure and which flows into a vacuum sealing relationship in the area of said truncated apex.

6. An electrically conductive joint between a conductor and a connector, comprising:
   (a) a metallic tube having an open seamless end to receive said conductor;
   (b) a crimp in said tube set back from said open end and including a substantially V-shaped outer crimp portion;
   (c) an inner crimp portion of substantially V-shape and having converging walls and a truncated apex of reverse curvature which is concave to said conductor, said conductor being secured between said outer crimp portion and said truncated apex;
   (d) whereby said conductor is secured within said crimp in a substantially gas impervious relationship.

7. An electrically conductive joint between a conductor and a connector, comprising:
   (a) a metallic tube having an open seamless end to receive a conductor;
   (b) a crimp in said tube set back from said open end and including a substantially V-shaped outer portion having outer arms and an outer apex;
   (c) an inner crimp portion of substantially V-shape and including inner arms and a truncated inner apex; said conductor being secured between said inner and outer apexes;
   (d) said inner arms being bent back approximately one hundred and eighty degrees and said inner and outer arms extending parallel to one another for at least a portion of said crimp;
   (e) whereby said conductor is secured within said crimp in substantially gas impervious relationship.

* * * * *